(12) United States Patent
Winstead et al.

(10) Patent No.: US 10,298,262 B2
(45) Date of Patent: May 21, 2019

(54) DECODING LOW-DENSITY PARITY-CHECK MAXIMUM-LIKELIHOOD SINGLE-BIT MESSAGES

(71) Applicants: Chris Winstead, Providence, UT (US); Emmanuel Boutillon, Lorient (FR)

(72) Inventors: Chris Winstead, Providence, UT (US); Emmanuel Boutillon, Lorient (FR)

(73) Assignee: Utah State University, Logan, Cache County, UT (US)

( * ) Notice: Subject to any disclaimer, the term of this patent is extended or adjusted under 35 U.S.C. 154(b) by 0 days.

(21) Appl. No.: 15/042,365

(22) Filed: Feb. 12, 2016

(65) Prior Publication Data

US 2016/0241257 A1    Aug. 18, 2016

Related U.S. Application Data

(60) Provisional application No. 62/115,248, filed on Feb. 12, 2015.

(51) Int. Cl.
| | |
|---|---|
| *H03M 13/11* | (2006.01) |
| *H03M 13/45* | (2006.01) |
| *H03M 13/00* | (2006.01) |

(52) U.S. Cl.
CPC .... *H03M 13/1108* (2013.01); *H03M 13/1117* (2013.01); *H03M 13/451* (2013.01); *H03M 13/6577* (2013.01)

(58) Field of Classification Search
CPC ......... H03M 13/1108; H03M 13/6577; H03M 13/451; H03M 13/1117
See application file for complete search history.

(56) References Cited

U.S. PATENT DOCUMENTS

2015/0381206 A1*  12/2015  Fainzilber .......... H03M 13/1108
                                                            714/758

OTHER PUBLICATIONS

The Faculty of Engineering and Science Aalborg University, "Message Passing Algorithm and Linear Programming Decoding for LDPC and Linear Block Codes", Jan. 4, 2007.*
Gopalakrichnan, S. et al., Noisy Gradient Descent Bit-Flip Decoding for LPDC Codes, IEEE Transactions on Communications, Oct. 17, 2014, 3385-3400, vol. 62, No. 10, IEEE.
Winstead, C. et al., Recent results on bit-flipping LDPC decoders, National School of Telecommunications of Brittany, Apr. 23, 2014, Brest, France.
Tithi, T. et al., Decoding LDPC codes via Noisy Gradient Descent Bit-Flipping with Re-Decoding, arXiv:1503.08913, Mar. 31, 2015.
Winstead et al., Decoding LDPC Codes With Locally Maximum-Likelihood Binary Messages, IEEE Communications Letters, Dec. 1, 20014, vol. 18, No. 12.

* cited by examiner

*Primary Examiner* — April Y Blair
*Assistant Examiner* — Rong Tang

(57) ABSTRACT

For decoding messages, a decoder exchanges single-bit messages for a data channel between a plurality of M parity nodes and a plurality of N symbol nodes. Each parity node has one or more adjacent symbol nodes with a plurality of edges between the parity node and each adjacent symbol node. An extrinsic decision and an extrinsic parity value are calculated based on a time-varying lookup table. The lookup table stores the locally maximum-likelihood extrinsic decision for a quantized number of data channel states as a function of adjacent extrinsic parity values.

19 Claims, 9 Drawing Sheets

DECODING LOW-DENSITY PARITY-CHECK MAXIMUM-LIKELIHOOD SINGLE-BIT MESSAGES

CROSS-REFERENCE TO RELATED APPLICATIONS

This application is a conversion of and claims priority to U.S. Provisional Patent Application No. 62/115,248 entitle "DECODING LOW-DENSITY PARITY-CHECK MAXIMUM-LIKELIHOOD SINGLE-BIT MESSAGES" and filed on Feb. 12, 2015 for Chris Winstead, which is incorporated herein by reference.

BACKGROUND

Field

The subject matter disclosed herein relates to decoding messages and more particularly relates to decoding messages using locally maximum-likelihood binary messages.

Description of the Related Art

Data channels are often noisy, resulting in data errors that must be corrected during decoding.

BRIEF SUMMARY OF THE INVENTION

A method is disclosed for decoding messages using locally maximum-likelihood binary messages. A decoder exchanges single-bit messages for a data channel between a plurality of M parity nodes and a plurality of N symbol nodes. Each parity node has one or more adjacent symbol nodes with a plurality of edges between the parity node and each adjacent symbol node. An extrinsic decision and an extrinsic parity value are calculated based on a time-varying lookup table. The lookup table stores the locally maximum-likelihood extrinsic decision for a quantized number of data channel states as a function of adjacent extrinsic parity values.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 1:
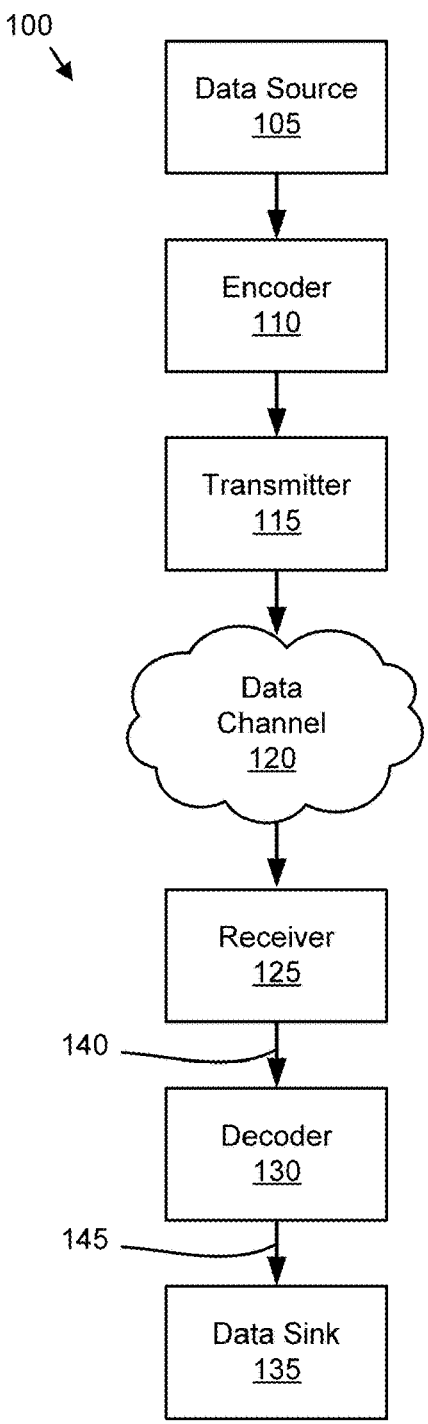
FIG. 1 is a schematic block diagram illustrating one embodiment of a decoding system.

As will be appreciated by one skilled in the art, aspects of the embodiments may be embodied as a system, method or program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a program product embodied in one or more computer readable storage devices storing machine readable code, computer readable code, and/or program code, referred hereafter as code. The storage devices may be tangible, non-transitory, and/or non-transmission. The storage devices may not embody signals. In a certain embodiment, the storage devices only employ signals for accessing code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in code and/or software for execution by various types of processors. An identified module of code may, for instance, comprise one or more physical or logical blocks of executable code which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different computer readable storage devices. Where a module or portions of a module are implemented in software, the software portions are stored on one or more computer readable storage devices.

Any combination of one or more computer readable medium may be utilized. The computer readable medium may be a computer readable storage medium. The computer readable storage medium may be a storage device storing the code. The storage device may be, for example, but not limited to, an electronic, magnetic, optical, electromagnetic, infrared, holographic, micromechanical, or semiconductor system, apparatus, or device, or any suitable combination of the foregoing.

More specific examples (a non-exhaustive list) of the storage device would include the following: an electrical connection having one or more wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Code for carrying out operations for embodiments may be written in any combination of one or more programming languages including an object oriented programming language such as Python, Ruby, Java, Smalltalk, C++, or the like, and conventional procedural programming languages, such as the "C" programming language, or the like, and/or machine languages such as assembly languages. The code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and program products according to embodiments. It will be understood that each block of the schematic flowchart diagrams and/or schematic block diagrams, and combinations of blocks in the schematic flowchart diagrams and/or schematic block diagrams, can be implemented by code. These code may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The code may also be stored in a storage device that can direct a computer, other programmable data processing apparatus, or other devices to function in a particular manner, such that the instructions stored in the storage device produce an article of manufacture including instructions which implement the function/act specified in the schematic flowchart diagrams and/or schematic block diagrams block or blocks.

The code may also be loaded onto a computer, other programmable data processing apparatus, or other devices to cause a series of operational steps to be performed on the computer, other programmable apparatus or other devices to produce a computer implemented process such that the code which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and program products according to various embodiments. In this regard, each block in the schematic flowchart diagrams and/or schematic block diagrams may represent a module, segment, or portion of code, which comprises one or more executable instructions of the code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and code.

The description of elements in each figure may refer to elements of proceeding figures. Like numbers refer to like elements in all figures, including alternate embodiments of like elements.

Winstead, Chris and Boutillon, Emmanuel, "Decoding LDPC Codes with Maximum-Likelihood Single-Bit Messages" is incorporated herein by reference.

FIG. 1 is a schematic block diagram illustrating one embodiment of a decoding system 100. The system 100 includes a data source 105, an encoder 110, a transmitter 115, a data channel 120, a receiver 125, a decoder 130, and a data sink 135. The system 100 may communicate data from the data source 105 to the data sink 135.

The data source 105 may generate data. The encoder 110 may encode the data for transmission using one or more encoding algorithms to increase transmission accuracy. The transmitter 115 may transmit the data over the data channel 120. The data channel 120 may include a fiber-optic channel and/or an electrical channel. In addition, the data channel 120 may include one or more networks including the Internet, a wide area network, a local area network, a mobile telephone network, or combinations thereof.

The data channel 120 may introduce noise to the data. As a result, when the data is received at the receiver 125, the representation of the data values may differ from those originally transmitted from the transmitter 115. In one embodiment, the receiver 125 receives the data as analog values and generates digital values from the analog values that are communicated in an input data stream 140. For example, the receiver 125 may receive the data values 0.4, −0.2, −0.5, and −0.9 and generate the binary values +1, −1, −1, −1.

The decoder 130 receives the input data stream 140 from the receiver 125 and generates a decoded output data stream 145 that corrects transmission errors due to noise in the data. The data may then be received by the data sink 135.

The data is typically transmitted through the system 100 with redundancies including redundant data, parity codes, error codes, and the like so that transmission errors may be detected and/or corrected. However, recovering the transmitted data using the redundancies can also be costly, requiring significant hardware resources. In addition, accommodating error correction may result in lower data transmission rates.

The embodiments described herein employ locally maximum-likelihood binary messages to correct errors in the input data stream 140. The decoder 130 may exchange single-bit messages for the data channel 120 between a plurality of M parity nodes and a plurality of N symbol nodes as will be described hereafter. In addition, the decoder 130 calculates an extrinsic decision and an extrinsic parity value over a local neighborhood for each edge between a parity node in a symbol node. In one embodiment, the decoder 130 updates a posterior decision at each symbol node. In addition, the decoder 130 generates the output data stream 145 from the posterior decisions as will be described hereafter.

Figure 2A:
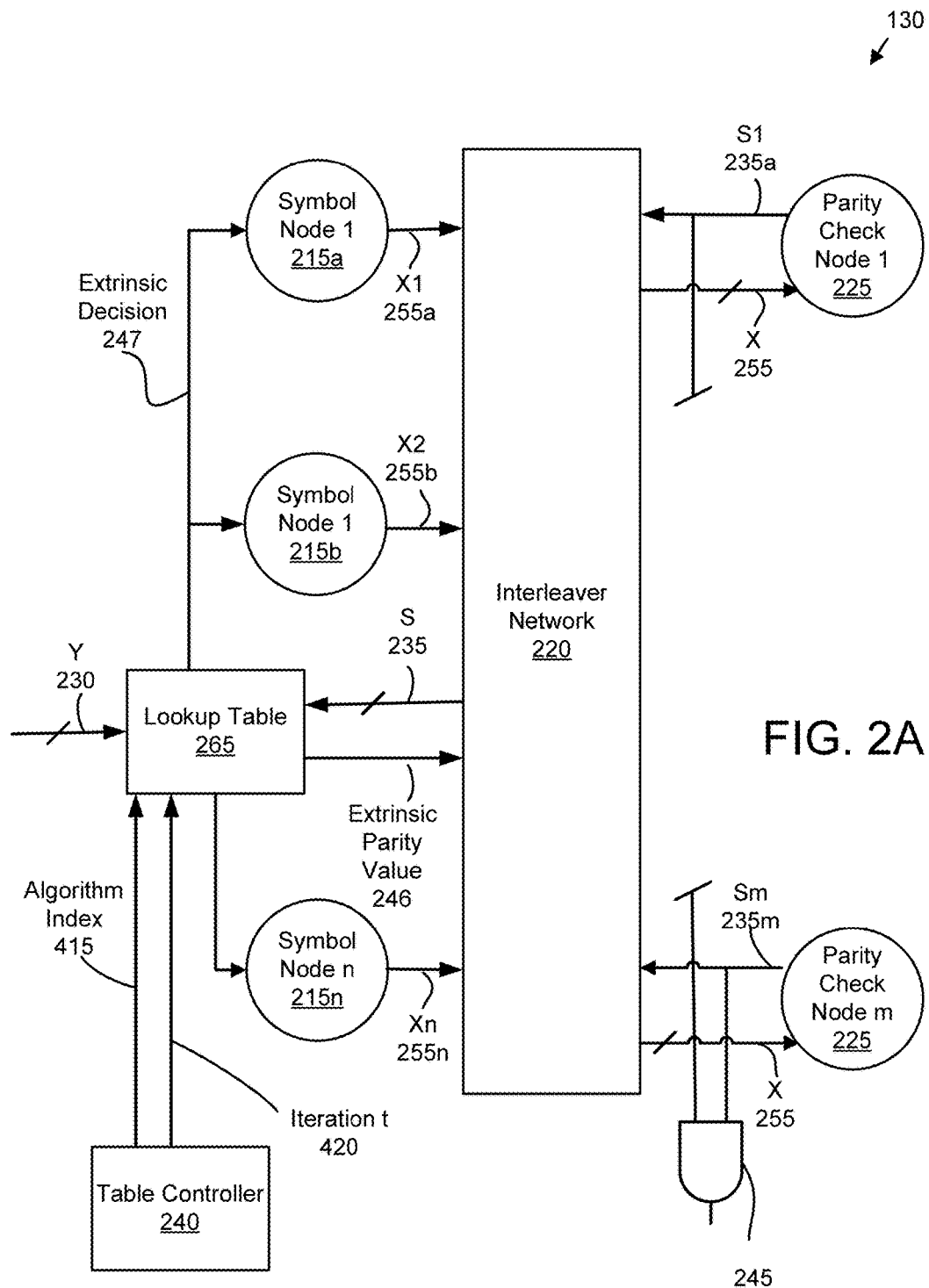
FIG. 2A is a schematic block diagram illustrating one embodiment of a decoder.

FIG. 2A is a schematic block diagram illustrating one embodiment of the decoder 130. In the depicted embodiment, the decoder 130 is embodied in a plurality of semiconductor devices. Alternatively, the decoder 130 may be embodied in a processor and computer readable storage medium with the processor executing code stored by the computer readable storage medium. In the depicted embodiment, the decoder 130 includes a lookup table 265, a table controller 240, one or more symbol nodes 215, an interleaver network 220, one or more parity nodes 225, and parity check logic 245.

The lookup table 265 may be time-varying and store local maximum-likelihood extrinsic decisions 247 for a quantized number of data channel states as a function of adjacent extrinsic parity values 246. The lookup table 265 may receive a plurality of input bits y 230 of the input data stream 140. The input data stream 140 may comprise N input bits y 230. In addition, the lookup table 265 receives M parity check results s 235 that are generated as a function of previous output bits x 255. The lookup table 265 is further controller by the table controller 240. The table controller 240 may generate an algorithm index 415 and an iteration t 420 that control iterations of the lookup table 265.

The lookup table 265 may calculate the extrinsic decision 247 and the extrinsic parity value 246 for each symbol node 215 for a plurality of sequential iterations t 420 and for values of the algorithm index 415. The symbol nodes 215 generate the output bits x 255 from the extrinsic decisions 247 as posterior decisions. The extrinsic decisions 247 are routed by the interleaver network 220 and checked at the parity check nodes 225. The interleaver network 220 is described in more detail in FIG. 2B.

The parity check nodes 225 determine if the output bits x 225 form a valid output data stream 145. In one embodiment, if each parity check result s 235 is asserted, the parity check logic 245 may indicate that the output data stream 145 is valid.

The iteration t 420 may be incremented and the parity check results s 235 may be fed back through the interleaver network 220 to the lookup table 265 to calculate the next iteration of extrinsic decisions 247 and extrinsic parity values 246. Alternatively, the current iteration t 420 may be reset to zero and the algorithm index 415 may be incremented in response to one of no change in the single-bit messages such as the output bits x 255 and the parity check results s 235 over an iteration t 420 and/or the current iteration t 420 equaling an iteration threshold L. When the parity check logic 245 indicates that the output bits x 225 form a valid output data stream 145, the output data stream 145 is transmitted.

Figure 2B:
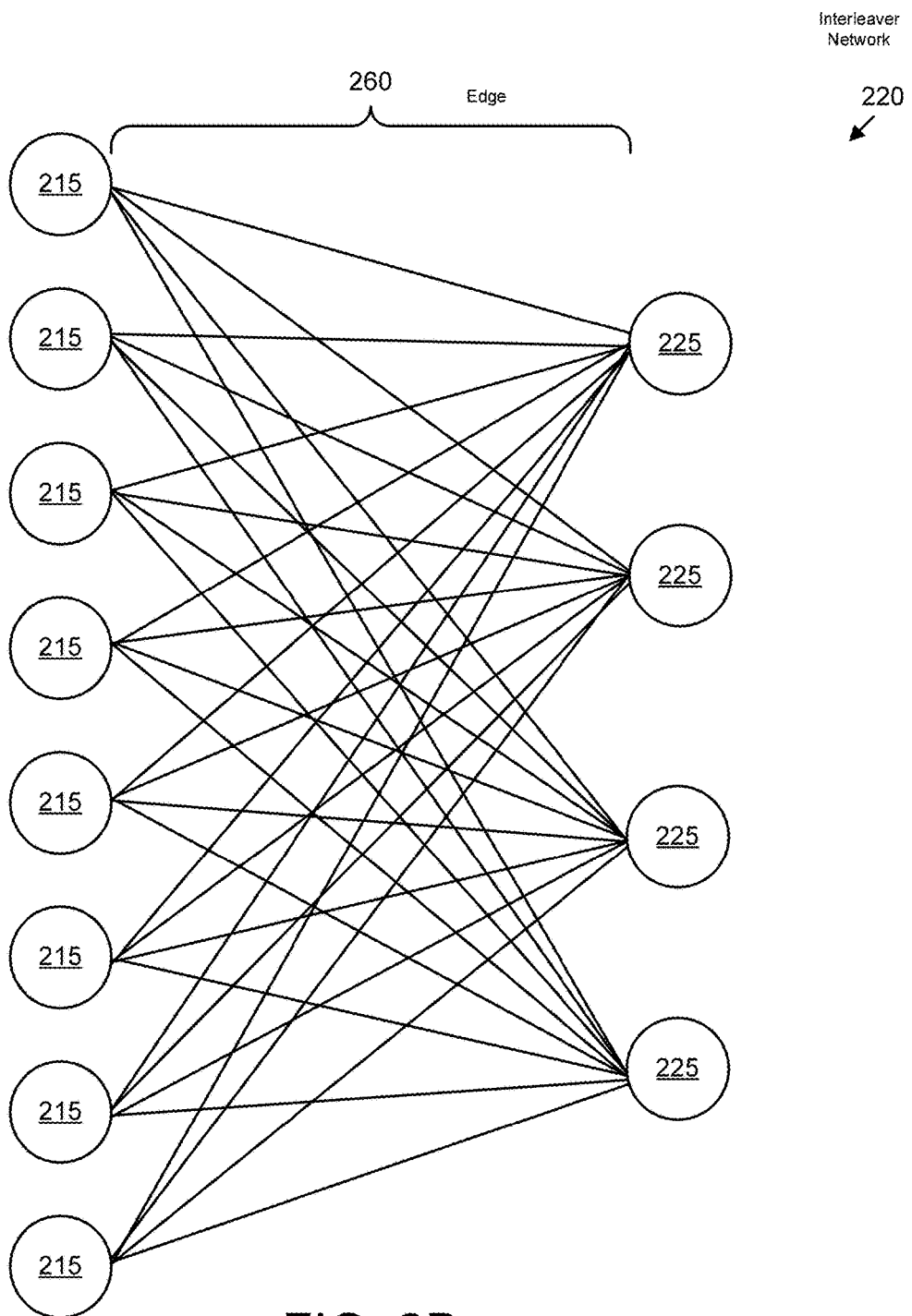
FIG. 2B is a schematic block diagram illustrating one embodiment of an interleaver network.

FIG. 2B is a schematic block diagram illustrating one embodiment of N symbol nodes 215 and M parity nodes 225. Any number of symbol nodes 215 and parity nodes 225 may be employed. There is typically a symbol node 215 for each output bit x 255 of the data channel 120. Each symbol node 215 is in communication with multiple parity nodes 225 through the interleaver network 220. Each symbol node 215 and parity node 225 that is in communication is said to be adjacent. Each adjacent relationship between a symbol node 215 and a parity node 225 is referred to as an edge 260.

In one embodiment, a parity check matrix h is defined for the symbol nodes 215 and the parity nodes 225. An edge 260 exists between a symbol node $S_i$ 215 and a parity node $P_j$ 225 only if $h_{ij}=1$.

Figure 2C:
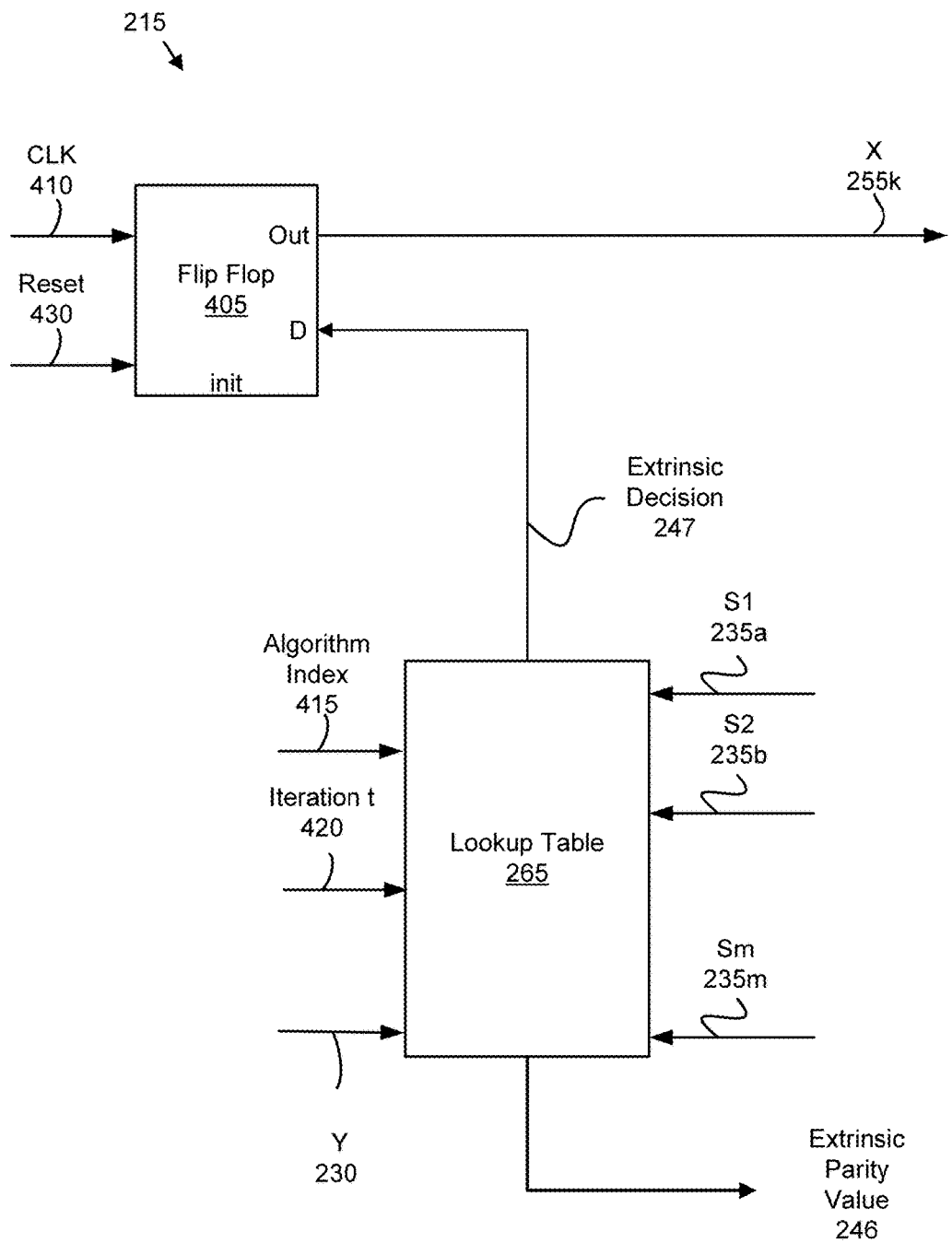
FIG. 2C is a schematic block diagram illustrating one embodiment of a symbol node.

FIG. 2C is a schematic block diagram showing one embodiment of a symbol node 215. The symbol node 215 may include a flip flop 405. The flip flop 405 may store the extrinsic decision 247 from the lookup table 265 as a posterior decision. The extrinsic decision 247 and extrinsic parity value 246 for the symbol node 215 may be generated from a quantized number Q of data channel states. The quantized number Q may be the number input bits 230. In one embodiment, Q is in the range of 3-5.

In addition, the flip flop 405 may output the stored extrinsic decision $\mu ij$ 247 as the output bit x 255. A reset 430 may reset the flip flop 405 to a specified value. A clock 410 may store the extrinsic decision 247.

The interleaver network 220 communications the output bit x 255 from each symbol node $S_i$ 215 to one or more parity check nodes $P_j$, 225. The parity check nodes 225 generate parity results s 235.

Figure 3A:
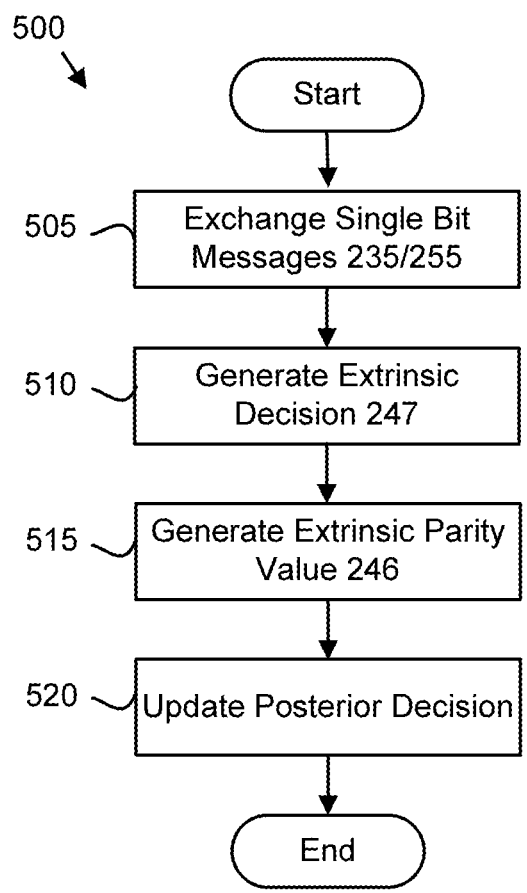
FIG. 3A is a schematic flow chart diagram illustrating one embodiment of a decision updating method.

FIG. 3A is a schematic flow chart diagram illustrating one embodiment of a decoding method 500. The method 500 may be performed by the decoder 130 and/or the system 100. Alternatively, the method 500 may be performed by a processor.

The method 500 starts, and in one embodiment the symbol nodes 215 in the parity nodes 225 exchange 505 output bit 255 and parity check result 235 single-bit messages for the data channel 120. Each parity node 225 has one or more adjacent symbol nodes with a plurality of edges 260 between the parity node 225 and each adjacent symbol node 215.

The decoder 130 calculates 510 an extrinsic decision and an extrinsic parity value over a local neighborhood for each edge 260. In one embodiment, the extrinsic decision is calculated 510 using the lookup table 265.

In response to the output bit x 255 and the parity check results s 235, the lookup table 265 may be preprogrammed to calculate the extrinsic decision 247 and the extrinsic parity value 246. In one embodiment, the input data stream 140 is quantized with $N_Q$ levels uniformly spaced between $-Y_{max}$ and $+Y_{max}$. Within that range, the quantized input bit ỹi 230 is given by Equation 1.

$$\tilde{y}_i = \text{sign}(y_i)\left(\frac{|y_i|(N_Q-1)}{2Y_{max}} + 0.5\right)\left(\frac{2Y_{max}}{N_Q-1}\right) \quad \text{Equation 1}$$

For a binary-input white Gaussian noise, the probabilities conditioned on the output bit $x_i$ 255 are calculated by Equations 2 and 3, where $\tilde{y}_i^+$ and $\tilde{y}_i^-$ are upper and lower boundary points of a quantization interval that contains $\tilde{y}_i$ and $F_{-1}$ and $F_{+1}$ are Gaussian cumulative distribution functions with variance $\sigma^2 = N_0/2$ and means of $-1$ and $+1$ respectively.

$$Pr(\tilde{y}_i|x_i=-1)=F_{-1}(\tilde{y}_i^+)-F_{-1}(\tilde{y}_i^-) \quad \text{Equation 2}$$

$$Pr(\tilde{y}_i|x_i=1)=F_{+1}(\tilde{y}_i^+)-F_{+1}(\tilde{y}_i^-) \quad \text{Equation 3}$$

Initially, at iteration t=0 420, the symbol nodes 215 send extrinsic decisions $\mu_{ij}$ 247 $\mu_{ij}=\text{sign}(\tilde{y}_i)$ for every i=1; 2; : : : ; N and j ∈ M(i)\j. The initial extrinsic decisions $\mu_{ij}$ 247 have average error probability $p_e(t=0)=F_{+1}(0)$. The parity check nodes 225 respond by computing parity check results s 235 $s_{ji}=\Pi_{k\in N(j)\setminus i}\mu_{ij}$. The frequency of erroneous parity check results s 235, herein after $p_c$, is calculated by enumerating over events with an odd number of extrinsic decisions $\mu_{ij}$ 247 errors as shown in Equation 4.

$$p_c = \sum_{j=0}^{\lfloor\frac{d_c-1}{2}\rfloor} \binom{d_c-1}{1+2j}(1-p_e)^{d_c-2-2j}p_e^{1+2j} \quad \text{Equation 4}$$

At each of the symbol nodes 215, parity check messages 235 are received. $S_{ij}$ may be a number of erroneous messages from neighbors in M(i)\j and may have a binomial distribution as shown in Equations 5.

$$Pr(S_{ij}|x_i=x_i) = \binom{d_c-1}{S_{ij}}p_c^{S_{ij}}(1-p_c)^{d_v-1-S_{ij}} \quad \text{Equation 5}$$

In one embodiment, $S_{ij}$ and $\tilde{y}_i$ are conditionally independent given $x_i$ within a neighborhood M(i)\j, so that an initial extrinsic decision $\mu_{ij}$ 247 may be calculated using Equation 6.

$$\mu_{ij}=\arg\max Pr(\tilde{y}_i|x_i)Pr(S_{ij}|x_i) \quad \text{Equation 6}$$

The results of evaluating Equation 6 are arranged as a function $\Phi_x(k,S)$ in the lookup table 265, where $\Phi_{+1}(y_i,S_{ij})$ and $\Phi_{-1}(y_i,S_{ij})$ are probability functions of the extrinsic decision being +1 and −1 respectively as a function of $y_i$ and $S_{ij}$ for iteration t 420. The lookup table 265 may include $N_Q$ rows and $d_v$ columns. In one embodiment, the extrinsic decision $\mu_{ij}$ 247 is calculated using Equation 7.

$$\mu_{ij} = \begin{cases} +1, & \Phi_{+1}(y_i,S_{ij}) > \Phi_{-1}(y_i,S_{ij}) \\ -1, & \Phi_{+1}(y_i,S_{ij}) < \Phi_{-1}(y_i,S_{ij}) \\ \text{sign}(\tilde{y}_i), & \text{otherwise} \end{cases} \quad \text{Equation 7}$$

In one embodiment, the lookup table 265 may be modified based on a predetermined schedule by the algorithm index 415 and/or the iteration 420. For example, after a specified number of iterations t 420, the lookup table 265 may implement a Gallager-A decoding stage.

The lookup table 265 may store a local maximum-likelihood extrinsic decision 247 for a quantized number of data channel state input bits 230 as a function of adjacent extrinsic parity values 246. In one embodiment, the extrinsic decision $\mu_{ij}$ 247 generated by the lookup table 265 may be modified in successive iterations t 420 based on the extrinsic parity value $p_e$ 246 as shown in Equation 8, $$p_e(t+1)=\Sigma_{\epsilon_{+1}(t)}\Phi_{+1}^{(t)}(y,S) \quad \text{Equation 8}$$

The decoder 130 may further update 515 posterior decisions in the output bits 255 at each symbol node 215 and the method 500 ends.

Figure 3B:
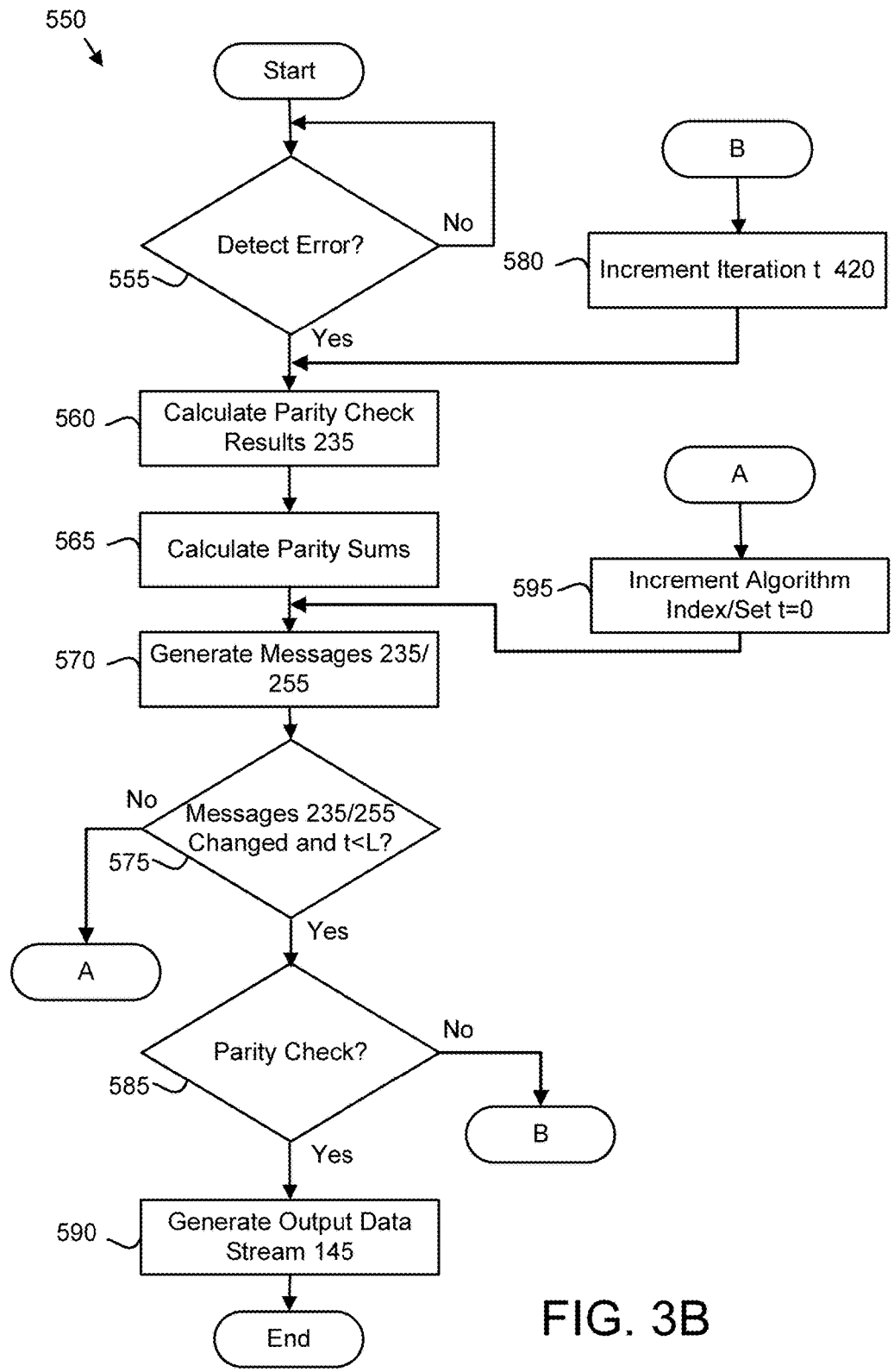
FIG. 3B is a schematic flow chart diagram illustrating one embodiment of a decoding method.

FIG. 3B is a schematic flow chart diagram illustrating one embodiment of a decoding method 550. The method 550 generates the decoded output data stream 145 from the input data stream 140. The method 550 may be performed by the decoder 130 and/or the system 100. Alternatively, the method 550 may be performed by a processor.

The method 550 starts, and in one embodiment, the parity check nodes 225 determine 555 if a parity check error is detected in the input data stream 140. If the parity check air is not detected, the parity check nodes 225 continue to determine 555 if there is a parity check error.

If the parity check error is detected, the parity check nodes 225 calculate 560 parity check results 235 for the time-varying lookup table 265. In addition, the parity check logic 245 may calculate 565 parity sums for the lookup table 265.

The lookup table 265 may generate 570 the extrinsic decision 247 and extrinsic parity value 246 single-bit messages for the current iteration t 420. In one embodiment, the table controller 240 determines 575 if the extrinsic decision 247 and extrinsic parity value 246 single-bit messages have changed from the previous iteration t−1 420. If the single-bit messages have not changed, the table controller 240 may reset the iteration t 420 to zero and increment the algorithm index 415. The lookup table 265 may further generate 570 the extrinsic decision 247 and extrinsic parity value 246 single-bit messages for the iteration t 420.

If the single-bit messages have changed, the parity check nodes 225 may determine 585 if the output bits 255 satisfy a parity check. If the output bits 255 do not satisfy the parity check, the table controller 240 may increment the iteration 420 to t+1 and the parity check nodes 225 may calculate 560 the parity check results 235. If the output bits 255 satisfy the parity check, the symbol nodes 215 generate 590 the output data stream 145 from the output bits 255 and the method 550 ends.

Figure 4A:
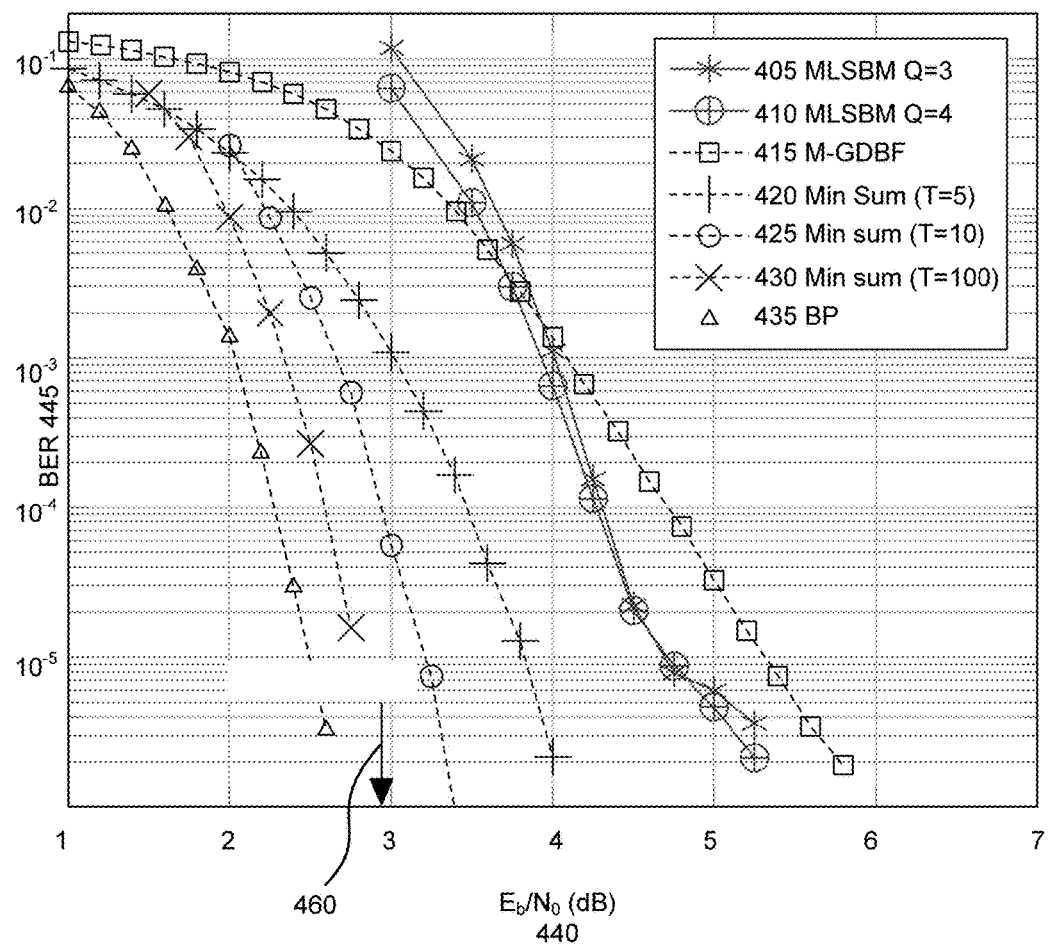
FIG. 4A is a chart illustrating one embodiment of a simulated decoding performance.
Figure 4B:
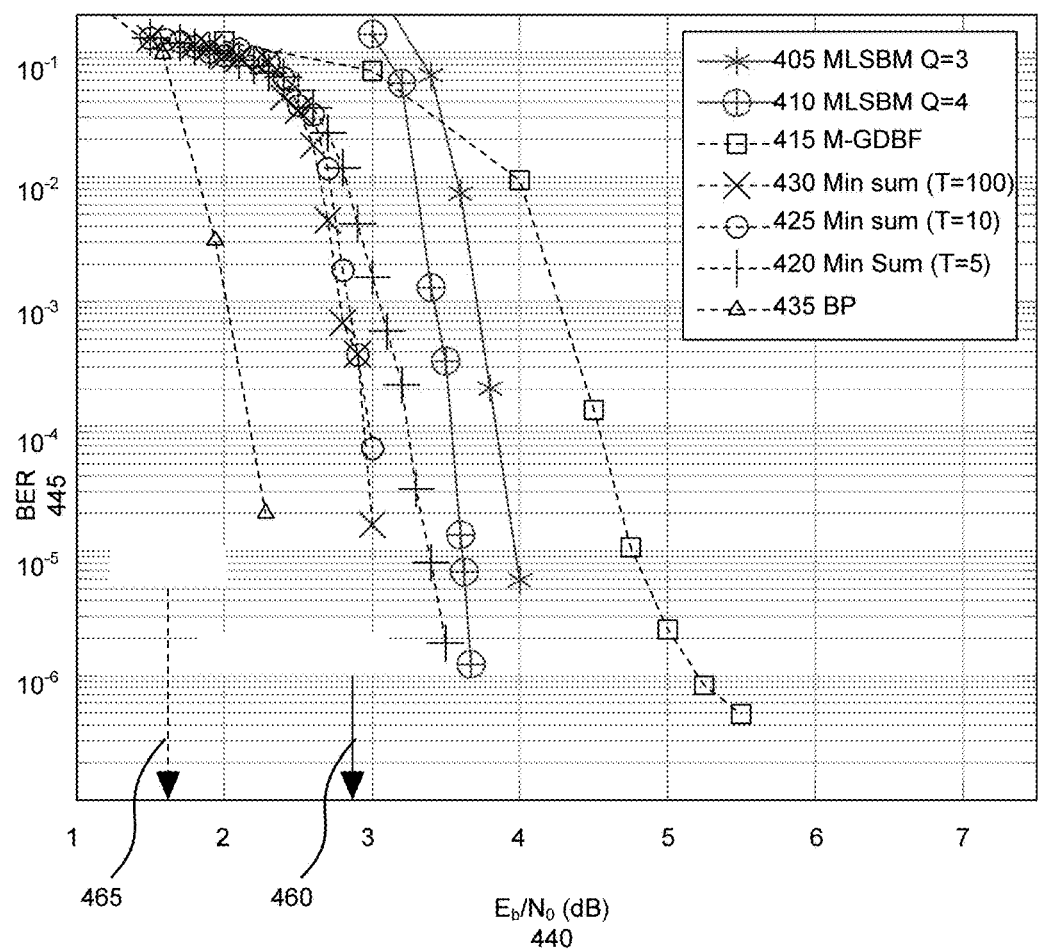
FIG. 4B is a chart illustrating one alternate embodiment of a simulated decoding performance.
Figure 4C:
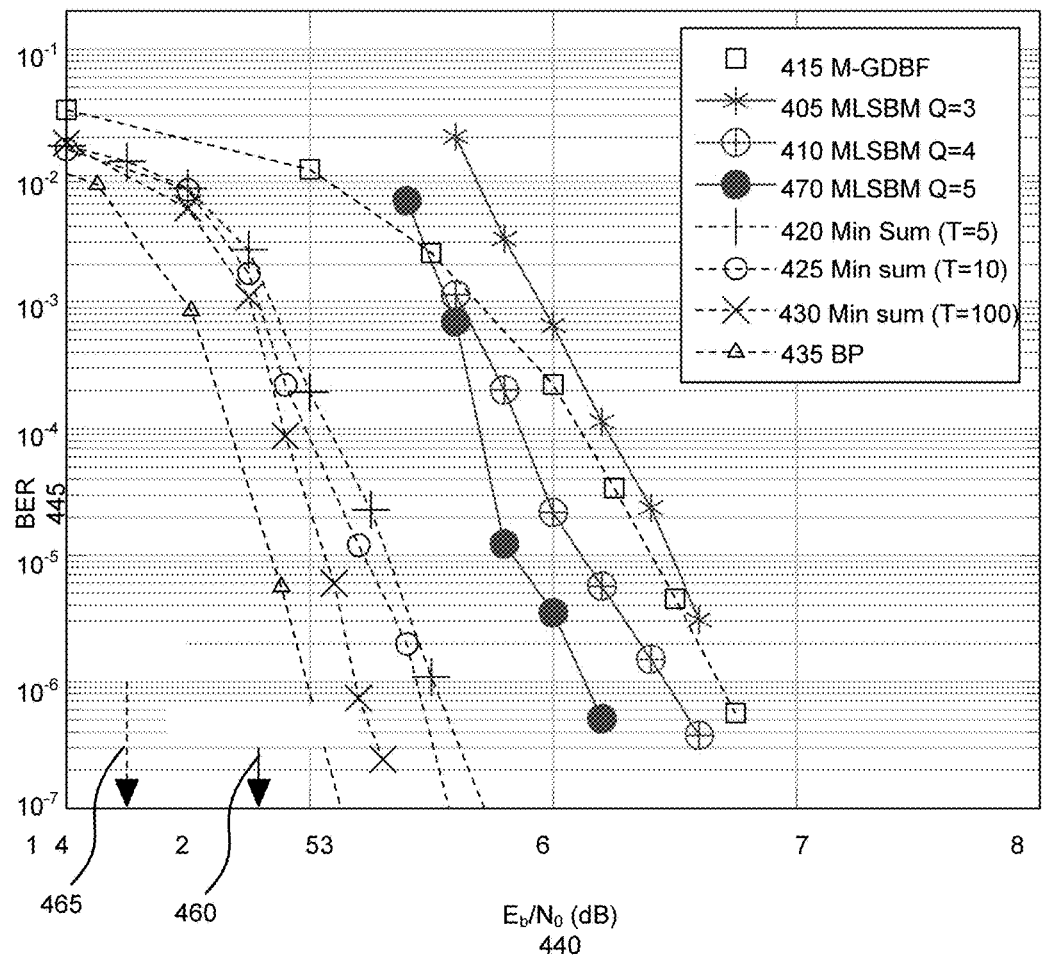
FIG. 4C is a chart illustrating one alternate embodiment of a simulated decoding performance.

FIGS. 4A-C are charts illustrating one embodiment of a simulated decoding performance. The bit error rates (BER) 445 for various embodiments of decoding based on exchanging maximum-likelihood binary messages (MLSBM) 405/410 are simulated at various signal-to-noise ratio values $E_b/N_o$ 440 measured in decibels (dB). The embodiments include quantized channel samples Q of Q=3 405 and Q=4 410. In addition, the BER 445 for prior art minimum sum floating point decoding calculations 420/425/430 for 5, 10 and 100 iterations respectively are shown for comparison. The BER 445 for a multi-bit Gradient Descent Bit Flipping (M-GDBF) algorithm 415 with a simulated maximum of 200 iterations using floating-point channel samples and a Belief Propagation (BP) algorithm 435 are also shown. Each simulation observed a minimum 200 bit errors and 20 frame errors. Regular low-density parity-check (LDPC) codes selected from MacKay's Encyclopedia of Sparse Graph Codes are employed.

In FIG. 4A, a (3,6) rate-½ code with length n=1008 bits and a MacKay's identifier of PEGRef504×1008 is simulated with the saturation magnitude $Y_{max}$ for the MLSBM 405/410 in the range of 1.4 to 1.6, γ=0.2 and T=50 maximum iterations, followed by a Gallager-A stage with a maximum of 10 iterations. A decoding threshold 460 for a MLSBM 405/410 is shown.

In FIG. 4B, a (4,8) rate-½ code with length n=4000 bits and a MacKay's identifier of PEGRef504×1008 is simulated. For MLSBM Q=4 410, the saturation magnitude $Y_{max}$=1.0, γ=0.5 and T=200 maximum iterations, and without a Gallager-A stage. For MLSBM Q=3 405, the saturation magnitude $Y_{max}$=1.5, γ=0.2 and T=200 maximum iterations, followed by a Gallager-A stage with a maximum of 10 iterations. A decoding threshold 460 for a MLSBM 405/410 and a decoding threshold 465 for the BP algorithm 435 are shown.

FIG. 4C is a rate-0.9356 regular code of length n=4376 bits, identified as code 4376.282.4.9598 in MacKay's Encyclopedia is simulated. The BER 445 for MLSBM of Q=3/4/5 405/410/470 are shown. For the simulation, the saturation magnitude $Y_{max}$=1.6, γ=0.2 and T=15 maximum iterations, followed by a Gallager-A stage with a maximum of 10 iterations By employing the locally maximum-likelihood binary messages and quantizing the number data channel states in the input bits 230, the embodiments support the storage of the decoding calculations in the lookup table 265. As a result, the input data stream 140 may be rapidly decoded with minimal hardware resources.

Embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for decoding messages comprising:
   receiving, by use of a time-varying lookup table, input data channel bits with input channel states from a receiver of a data channel;
   exchanging a prior extrinsic decision and a prior extrinsic parity single-bit messages for the data channel between a plurality of device M parity nodes and a plurality of device N symbol nodes, wherein each parity node has one or more adjacent symbol nodes with a plurality of edges between the parity node and each adjacent symbol node;
   calculating a current extrinsic decision and a current extrinsic parity value over a local neighborhood for each edge with the time-varying lookup table that is controlled by an algorithm index and an iteration time, wherein the time-varying lookup table calculates the current extrinsic decision $\mu_{i,j}$ where $$\mu_{ij} = \begin{cases} +1, & \Phi_{+1}(y_i, S_{ij}) > \Phi_{-1}(y_i, S_{ij}) \\ -1, & \Phi_{+1}(y_i, S_{ij}) < \Phi_{-1}(y_i, S_{ij}), \\ \text{sign}(\tilde{y}_i), & \text{otherwise} \end{cases}$$

where $y_i$ is an ith data channel state of a plurality of data channel states, j is a jth parity check node, $S_{ij}$ is a number of error messages from parity check nodes M(i)\j, and $\Phi_{+1}(y_i, S_{ij})$ and $\Phi_{-1}(y_i, S_{ij})$ are probability functions of the current extrinsic decision being +1 and −1 respectively as a function of $y_i$ and $S_{ij}$;

updating a posterior decision at each symbol node with the current extrinsic decision;

in response to detecting an error, calculating parity check results and parity sums for the time-varying lookup table;

in response to the current extrinsic decision and the current extrinsic parity having not changed from the prior extrinsic decision and the prior extrinsic parity respectively, resetting the iteration time to zero and incrementing the algorithm index;

in response to the current extrinsic decision and the current extrinsic parity having changed from the prior extrinsic decision and the prior extrinsic parity respectively, incrementing the iteration time and outputting bits that satisfy the parity check;

generating a corrected output data stream if the input data channel bits from the posterior decisions; and transmitting the corrected output data stream to a data sink.

2. The method of claim 1, where the time-varying lookup table stores local maximum-likelihood extrinsic decisions for a quantized number of data channel states as a function of adjacent extrinsic parity values.

3. The method of claim 2, wherein the time-varying lookup table calculates the extrinsic decision and the extrinsic parity value for a plurality of sequential iterations for a given algorithm index and wherein a current iteration t is reset to zero and the algorithm index is incremented in response to one of no change in the single-bit messages over an iteration and the current iteration equaling an iteration threshold.

4. The method of claim 2, the method further comprising:
   detecting an error;
   calculating parity check results for the time-varying lookup table; and
   calculating parity sums for the time-varying lookup table.

5. The method of claim 1, wherein the time-varying lookup table calculates the extrinsic parity value $p_e$ as $p_e$ as $p_e(t+1) = \Sigma_{\varepsilon_{+1}} {}^{(t)}\Phi_{+1}{}^{(t)}(y,S)$, where $\Phi_{+1}{}^{(t)}$ is a probability function of the extrinsic decision being +1 for iteration t, $y_i$ is an ith data channel state of a plurality of data channel states, and S is a number of error messages from parity nodes M(i)\j.

6. An apparatus comprising:
   a time-varying lookup table that receives input data channel bits with input channel states from a receiver of a data channel;
   a decoder that exchanges a prior extrinsic decision and a prior extrinsic parity single-bit messages for a data channel between a plurality of device M parity nodes and a plurality of device N symbol nodes, wherein each parity node has one or more adjacent symbol nodes with a plurality of edges between the parity node and each adjacent symbol node;

the time-varying lookup table calculates a current extrinsic decision and a current extrinsic parity value over a local neighborhood for each edge, wherein the time-varying lookup table is controlled by an algorithm index and an iteration time and calculates the current extrinsic decision $\mu_{i,j}$ where $$\mu_{ij} = \begin{cases} +1, & \Phi_{+1}(y_i, S_{ij}) > \Phi_{-1}(y_i, S_{ij}) \\ -1, & \Phi_{+1}(y_i, S_{ij}) < \Phi_{-1}(y_i, S_{ij}), \\ \text{sign}(\tilde{y}_i), & \text{otherwise} \end{cases}$$

where $y_i$ is an ith data chan plurality of data channel states, j is a jth parity check node, $S_{ij}$ is a number of error messages from parity check nodes M(i)\j, and $\Phi_{+1}(y_i,S_{ij})$ and $\Phi_{-1}(y_i,S_{ij})$ are probability functions of the current extrinsic decision being +1 and -1 respectively as a function of $y_i$ and $S_{ij}$, updates a posterior decision at each symbol node with the extrinsic decision, in response to detecting an error, calculates parity check results and parity sums for the time-varying lookup table, in response to the current extrinsic decision and the current extrinsic parity having not changed from the prior extrinsic decision and the prior extrinsic parity respectively, resets the iteration time to zero and incrementing the algorithm index, and in response to the current extrinsic decision and the current extrinsic parity having changed from the prior extrinsic decision and the prior extrinsic parity respectively, increments the iteration time and outputs bits that satisfy the parity check; and the decoder further generates a corrected output data stream of the input data channel bits from the posterior decisions and transmits the corrected output data stream to a data sink.

7. The apparatus of claim 6, where the time-varying lookup table stores local maximum-likelihood extrinsic decisions for a quantized number of data channel states as a function of adjacent extrinsic parity values.

8. The apparatus of claim 7, wherein the time-varying lookup table calculates the extrinsic decision and the extrinsic parity value for a plurality of sequential iterations for a given algorithm index and wherein a current iteration t is reset to zero and the algorithm index is incremented in response to one of no change in the single-bit messages over an iteration and the current iteration equaling an iteration threshold.

9. The apparatus of claim 7, the decoder further performs:
detecting an error;
calculating parity check results for the time-varying lookup table; and
calculating parity sums for the time-varying lookup table.

10. The apparatus of claim 6, wherein the time-varying lookup table calculates the extrinsic parity value $p_e$ as $p_e$ as $p_e(t+1)=\Sigma_{\varepsilon_{+1}}\omega\Phi_{+1}^{(t)}(y,S)$, where $\Phi_{+1}^{(t)}$ is a probability function of the extrinsic decision being +1 for iteration t, $y_i$ is an ith data channel state of a plurality of data channel states, and S is a number of error messages from parity nodes M(i)\j.

11. A system comprising:
a receiver of a data channel;
a time-varying lookup table that receives input data channel bits with input channel states from the receiver;
a decoder that exchanges a prior extrinsic decision and a prior extrinsic parity single-bit messages for a data channel between a plurality of device M parity nodes and a plurality of device N symbol nodes, wherein each parity node has one or more adjacent symbol nodes with a plurality of edges between the parity node and each adjacent symbol node;

the time-varying lookup table calculates a current extrinsic decision and a current extrinsic parity value over a local neighborhood for each edge and updates a posterior decision at each symbol node with the extrinsic decision, wherein the time-varying lookup table is controlled by an algorithm index and an iteration time and calculates the current extrinsic decision $\mu_{i,j}$ where $$\mu_{ij} = \begin{cases} +1, & \Phi_{+1}(y_i, S_{ij}) > \Phi_{-1}(y_i, S_{ij}) \\ -1, & \Phi_{+1}(y_i, S_{ij}) < \Phi_{-1}(y_i, S_{ij}), \\ \text{sign}(\tilde{y}_i), & \text{otherwise} \end{cases}$$

where $y_i$ is an ith data channel state of a plurality of data channel states, j is a jth parity check node, $S_{ij}$ is a number of error messages from parity check nodes M(i)\j, and $\Phi_{+1}(y_i,S_{ij})$ and $\Phi_{-1}(y_i,S_{ij})$ are probability functions of the current extrinsic decision being +1 and -1 respectively as a function of $y_i$ and $S_{ij}$, updates a posterior decision at each symbol node with the extrinsic decision, in response to detecting an error, calculates parity check results and parity sums for the time-varying lookup table, in response to the current extrinsic decision and the current extrinsic parity having not changed from the prior extrinsic decision and the prior extrinsic parity respectively, resets the iteration time to zero and incrementing the algorithm index, and in response to the current extrinsic decision and the current extrinsic parity having changed from the prior extrinsic decision and the prior extrinsic parity respectively, increments the iteration time and outputs bits that satisfy the parity check; and the decoder further generates a corrected output data stream of the input data channel bits from the posterior decisions and transmits the corrected output data stream to a data sink.

12. The system of claim 11, where the time-varying lookup table stores local maximum-likelihood extrinsic decisions for a quantized number of data channel states as a function of adjacent extrinsic parity values.

13. The system of claim 12, wherein the time-varying lookup table calculates the extrinsic decision and the extrinsic parity value for a plurality of sequential iterations for a given algorithm index and wherein a current iteration t is reset to zero and the algorithm index is incremented in response to one of no change in the single-bit messages over an iteration and the current iteration equaling an iteration threshold.

14. The system of claim 12, the decoder further performs:
detecting an error;
calculating parity check results for the time-varying lookup table; and
calculating parity sums for the time-varying lookup table.

15. The system of claim 11, wherein the time-varying lookup table calculates the extrinsic parity value $p_e$ as $p_e$ as $p_e(t+1)=\Sigma_{\varepsilon_{+1}}\omega\Phi_{+1}^{(t)}(y,S)$, where $\Phi_{+1}^{(t)}$ is a probability function of the extrinsic decision being +1 for iteration t, $y_i$ is an ith data channel state of a plurality of data channel states, and S is a number of error messages from parity nodes M(i)\j.

16. The method of claim 1, wherein the ith data channel state $_{yi}$ is calculated as $$\tilde{y}_i = \text{sign}(y_i)\left(\frac{|y_i|(N_Q - 1)}{2Y_{max}} + 0.5\right)\left(\frac{2Y_{max}}{N_Q - 1}\right),$$

wherein $Y_{max}$ is a saturation magnitude, Q is a quantized number of data channels, and $N_Q$ is a number of levels uniformly spaced between $-Y_{max}$ and $+Y_{max}$.

17. The apparatus of claim 6, wherein the ith data channel state $_{yi}$ is calculated as $$\tilde{y}_i = \text{sign}(y_i)\left(\frac{|y_i|(N_Q - 1)}{2Y_{max}} + 0.5\right)\left(\frac{2Y_{max}}{N_Q - 1}\right),$$

wherein $Y_{max}$ is a saturation magnitude, Q is a quantized number of data channels, and $N_Q$ is a number of levels uniformly spaced between $-Y_{max}$ and $+Y_{max}$.

18. The system of claim 11, wherein the ith data channel state $_{yi}$ is calculated as $$\tilde{y}_i = \text{sign}(y_i)\left(\frac{|y_i|(N_Q - 1)}{2Y_{max}} + 0.5\right)\left(\frac{2Y_{max}}{N_Q - 1}\right),$$

wherein $Y_{max}$ is a saturation magnitude, Q is a quantized number of data channels, and $N_Q$ is a number of levels uniformly spaced between $-Y_{max}$ and $+Y_{max}$.

19. The method of claim 1, wherein the time-varying lookup table is a semiconductor table.

* * * * *